(12) United States Patent
Herrmann et al.

(10) Patent No.: US 6,442,827 B1
(45) Date of Patent: Sep. 3, 2002

(54) METHOD OF MAKING SUPERCONDUCTOR STRAND

(75) Inventors: Peter Friedrich Herrmann, Corbreuse; Gérard Duperray, La Norville; Albert Leriche, Gif S/Yvette; Jean-Pierre Tavergnier, Linas, all of (FR)

(73) Assignee: Nexans, Paris (FR)

( * ) Notice: Subject to any disclaimer, the term of this patent is extended or adjusted under 35 U.S.C. 154(b) by 0 days.

(21) Appl. No.: 09/564,686

(22) Filed: May 4, 2000

(30) Foreign Application Priority Data

May 6, 1999 (FR) .............................. 99 05765

(51) Int. Cl.[7] .............................................. H01L 39/24
(52) U.S. Cl. ...................... 29/599; 174/125.1; 428/930; 505/211; 505/230
(58) Field of Search .................... 29/599, 825; 505/230, 505/211; 428/930; 179/125.1

(56) References Cited

U.S. PATENT DOCUMENTS 5,801,124 A * 9/1998 Gamble et al.
6,110,873 A * 8/2000 Duperray et al.

FOREIGN PATENT DOCUMENTS

| EP | 0769 819 A1 | 4/1997 |
|----|-------------|--------|
| EP | 769819 A1 * | 4/1997 |
| EP | 0 823 737 A1 | 2/1998 |
| EP | 823737 A1 * | 2/1998 |

* cited by examiner

*Primary Examiner*—Carl J. Arbes
(74) *Attorney, Agent, or Firm*—Sughrue Mion, PLLC

(57) ABSTRACT

The invention relates to a powder in tube type method of manufacturing an HTc superconductor multifilament conductor having a matrix of compatible silver alloy and in which, during preparation of the multifilament billet, the number of segments per layer is organized so that, in cross-section, the segment layers viewed as a whole have the general shape of a converging-diverging nozzle, the throat of the converging-diverging nozzle shape being substantially contained in said superposition midplane; and in which, during the mechanical treatment of said multifilament billet preceding the synthesis heat treatment, a rolling force is applied in a direction perpendicular to the superposition midplane, and at least one of the side edges of the rolled billet is cut off perpendicularly to the superposition midplane, thereby revealing the matrix of compatible silver alloy.

3 Claims, 2 Drawing Sheets

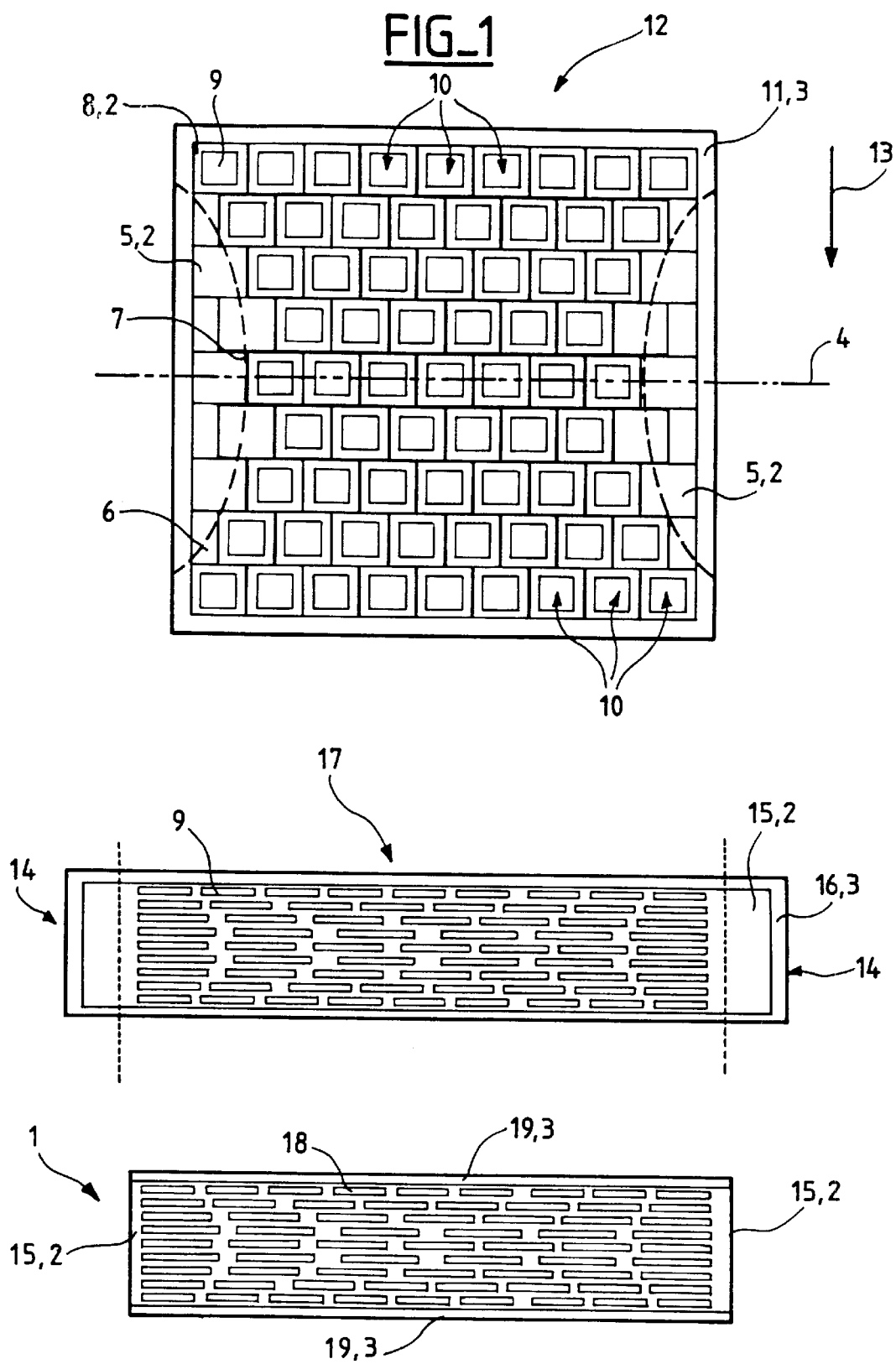

FIG_2A
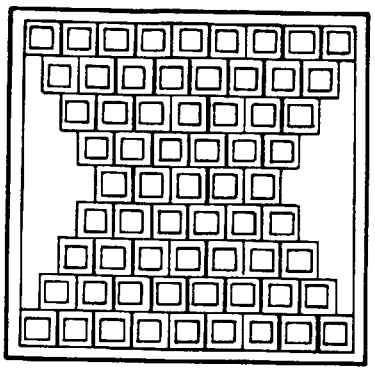
FIG_2B
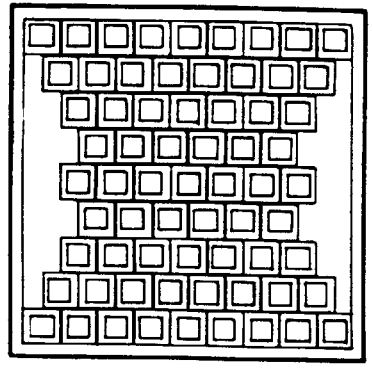
FIG_2D
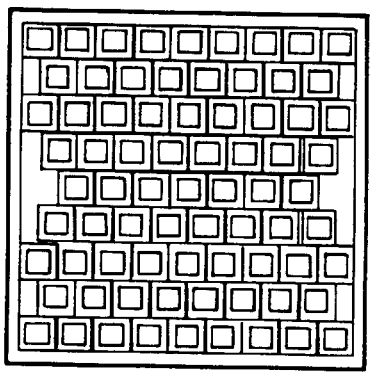
FIG_2C
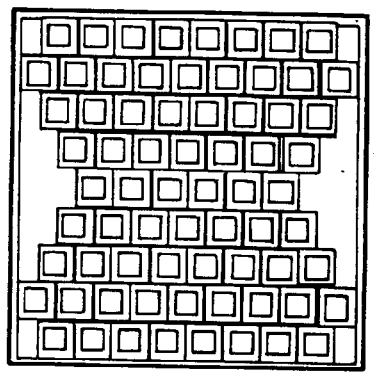
FIG_2E
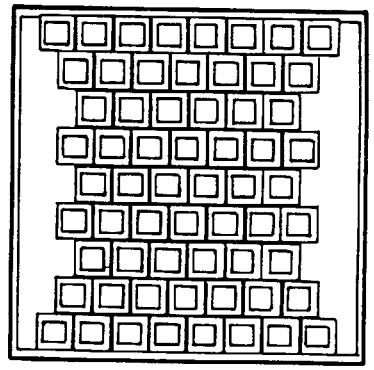

METHOD OF MAKING SUPERCONDUCTOR STRAND

The invention relates to a high critical temperature (HTc) superconductor strand, and to a method of manufacturing such a strand.

The invention relates more particularly to high critical temperature (HTc) superconductor strands manufactured by the "powder-in-tube" (PIT) method.

BACKGROUND OF THE INVENTION

The PIT technique is known per se and it consists in a first step in densifying HTc superconductor precursors in a metal tube. In a second step, the resulting billet is deformed, e.g. by wire-drawing so as to obtain a "monofilament" strand. In a third step, the monofilament strand is cut up and packed in a new metal case, thereby forming a multifilament billet. The new, multifilament billet is in turn deformed and shaped so as to obtain a multifilament strand having the desired dimensions and shape. During these manufacturing steps, and in order to transform the precursors into the HTc superconductor phase, it is necessary to perform various transforming heat treatments and various intermediate rolling operations to reactivate the precursors. The material constituting the tube or the case must be sufficiently ductile to be capable of withstanding the various wire-drawing and rolling stages, and it must be of a composition that is inert or at least without consequence for the heat treatment used to transform the HTc superconductor precursors into the superconductor phase. The material must be non-polluting with respect to the precursors and it must be sufficiently permeable to oxygen to pass the oxygen required for proper synthesis of the precursors. It is known that pure silver or a compatible silver alloy mixture (e.g. AgPa) can be used as the material for making the billets.

In the description below, the term "compatible silver alloy" is used to designate a silver alloy that is compatible with the stage of synthesizing the precursors, i.e. an alloy that is non-polluting and that is permeable to oxygen.

Certain applications using HTc superconductor multifilament strands require long continuous lengths (e.g. for superconductor coils). This requires methods of manufacture that enable strands of great length to be obtained in which the electrical and mechanical performance of the strand are maintained along its entire length (and in particular its superconductor phase).

FR 2 752 327 relates to a method of manufacturing an HTc superconductor multifilament strand having a compatible silver alloy matrix, which method is of the powder in tube type and in which:

a square or rectangular monofilament is made having a sheath of compatible silver ally and a core of HTc superconductor precursors;

said monofilament is cut up and the resulting segments are placed in a square or rectangular section compatible silver alloy case, thus making a multifilament billet; and the heat and mechanical treatments are applied to transform the precursors into the HTc superconductor phase and to obtain the final shape of the multifilament strand.

During manufacture of the multifilament billet, the monofilament segments are arranged layer by layer inside the case, each layer being offset relative to the preceding layer so as to form a configuration of the segment which is staggered in a direction that is perpendicular to the planes of the layers.

The advantages that result from the configuration of FR 2 752 327 are uniform densification of the filaments, a higher deformation ratio of the superconductor phase, and uniform flow of the silver, thereby reducing variations in the section of the strand. As a result, good control is obtained over long strands by reducing the number of defects that can give rise to breakages during manufacture. The compatible silver alloy material used is compatible with the stage of synthesizing the precursors.

Nevertheless, such a strand remains fragile since the compatible silver alloy material used does not have great mechanical strength. As a result the outer sheath of the strand can be torn and that has a significant effect on its properties.

Furthermore, because of the rolling operations, there are portions of the multifilament strand, in particular in the ends of the rectangular section of the strand, in which the density of superconductor filaments is very small. This contributes to poor performance in terms of "engineering" current density $J_e$ defined as being the ratio of current flowing in the strand divided by the total cross-section of said strand.

To mitigate the mechanical strength problems of the HTc multifilament strand, it is known to use silver alloys such as AgMg or AgCu.

Nevertheless:

Firstly those materials are polluting for the precursors and therefore can only be used as the outer case of the strand, while its matrix is made of pure silver or of compatible silver alloy (e.g. AgPa).

Secondly, those silver alloys which are required for maintaining the mechanical performance of the strand are not sufficiently permeable to oxygen to guarantee proper synthesis of the superconductor phase of the strand. This gives rise to a strand whose mechanical strength is good but whose electrical characteristics are poor.

In the description below, the term "non-compatible silver alloy" is used to designate a silver alloy that is not compatible with the precursor synthesizing stage, i.e. an alloy that is either polluting or else insufficiently permeable to oxygen.

OBJECTS AND SUMMARY OF THE INVENTION

An object of the present invention is to propose of method of manufacturing an HTc multifilament strand that enables improved mechanical strength, optimum synthesis of the superconductor stage, and increased current density $J_e$ all to be obtained simultaneously.

Another object of the present invention is to propose an HTc multifilament strand of great length presenting improved electrical performance and mechanical strength.

To this end, the invention provides a power-in-tube type method of manufacturing HTc superconductor multifilament conductor having a matrix of compatible silver alloy, in which:

a square or rectangular section monofilament is made having a sheath of compatible silver alloy and a core of HTc superconductor precursors;

said monofilament is cut up into segments and a square or rectangular section case of non-compatible silver alloy is filled with the resulting segments, the segments being placed in superposed layers centered in the case of non-compatible silver alloy, each layer being offset relative to the preceding layer so as to form a staggered configuration of the segments;

the gaps left by the offset at the beginnings and ends of the layers are filled with bars of compatible silver alloy, thereby making a multifilament billet that is symmetrical about a superposition midplane; and mechanical and heat treatments are applied respectively to obtain the final shape of the multifilament strand and to synthesize the precursors into the HTc superconductor phase;

wherein, during preparation of the multifilament billet, the number of segments per layer is organized so that, in cross-section, the segment layers viewed as a whole have the general shape of a converging-diverging nozzle, the throat of the converging-diverging nozzle shape being substantially contained in said superposition midplane; and wherein, during the mechanical treatment of said multifilament billet preceding the synthesis heat treatment, a rolling force is applied in a direction perpendicular to the superposition midplane, and at least one of the side edges of the rolled billet is cut off perpendicularly to the superposition midplane, thereby revealing the matrix of compatible silver alloy.

Advantageously, to limit the stresses due to rolling, the mechanical treatments include steps of thermally relaxing stresses.

The two edges perpendicular to the mean superposition plane can be cut off.

The invention also provides a multifilament strand having a generally rectangular matrix of compatible silver alloy, comprising a plurality of HTc superconductor filaments each of cross-section that is generally rectangular in shape and arranged in a configuration that is staggered layer on layer, wherein both opposite faces of the rectangular shape are covered in respective layers of non-compatible silver alloy.

A first advantage of the present invention results from the general converging-diverging nozzle shape of the monofilaments in the manufacturing billet. This disposition makes it possible, after the steps of mechanically rolling the strand, to concentrate the monofilaments in the central portion of the strand. Thus, high density and uniformity are obtained in the central portion of the strand, thereby restricting monofilament dispersion to the side edges of the strand.

Another advantage of the present invention results from the combination of using a non-compatible silver alloy material as the outer sheath for the strand and the step of cutting off at least one of the edges of the rolled billet so as to reveal the compatible silver alloy matrix. The non-compatible silver alloy ensures that the strand has good mechanical strength, while uncovering the compatible silver alloy matrix ensures that the precursors are properly synthesized. The result is a strand that has improved mechanical and electrical performance.

An advantage associated with the above advantage is the result of the fact that the excess compatible silver alloy matrix that is poor in monofilaments that results from the rolling and that is located in the side edges of the strand is itself removed during the cutting-off step. This considerably improves current density $J_e$.

BRIEF DESCRIPTION OF THE DRAWINGS

Other advantages and characteristics of the present invention appear from the following description given with reference to the accompanying drawings, in which:

FIG. 1 is a diagram showing some of the steps in the method of the present invention; and FIGS. 2A to 2E are diagrammatic cross-sections of multifilament billets that can be used in the method of the present invention.

MORE DETAILED DESCRIPTION

The present invention relates to a powder-in-tube method of manufacture for manufacturing an HTc superconductor multifilament conductor 1 having a matrix 15 of compatible silver alloy 2.

The steps of the method are as follows:

A square or rectangular section monofilament is made having a sheath 8 of compatible silver 2 and a core of HTc superconductor precursors 9. The monofilament is made from a billet comprising a compatible silver alloy case filled with precursors. The billet is then treated mechanically by wire-drawing and rolling so as to obtain the monofilament.

The monofilament is cut into segments and a square or rectangular case 11 of non-compatible silver alloy 3 is filled with the monofilament segments 10.

The segments 10 are laid in superposed layers centered within the case 11 of non-compatible silver alloy 3, each layer being offset relative to the preceding layer as to form a configuration of the segments 10 that is staggered in a direction 13 perpendicular to the plane 4 of the layers.

In addition, the number of segments 10 per layer is adapted so that the general shape of the layers of segments 10 in the cross-section of the billet 12 is that of a converging-diverging nozzle 6.

The throat 7 of the converging-diverging nozzle shape is contained substantially in a superposition midplane 4 defined as being parallel to the layers of segments 10 and in the middle of the case 11.

To finish off filling the case 11, the gaps left by the offsets at the beginnings and ends of the layers are filled with bars 5 of compatible silver alloy 2, thus providing a multifilament billet 12 that is symmetrical about the superposition midplane 4.

Mechanical treatment is applied so as to obtain the final shape of the multifilament strand. The mechanical treatment includes, in particular, rolling the billet in the direction 13 perpendicular to its midplane 4.

Because of the initial configuration of the monofilament segments 10 inside the billet 12, and because of an appropriate selection for the width of the multifilament strand after the mechanical treatment, a multifilament strand is obtained that presents a sheath 16 of non-compatible silver alloy 3, a matrix 15 of compatible silver alloy 2, and precursor filaments 9 that are embedded in the matrix 15 of compatible silver alloy 2 and that are concentrated in the central portion 17 of the strand, with the two side edges 14 of the strand being free of or at least poor in precursor filaments 9.

In order to relax the mechanical stresses that result from applying mechanical treatment to the strand, a step of thermally relaxing the stresses can be provided.

At least one of the side edges 14 is cut off the strand perpendicularly to the superposition midplane 4. This step of the method reveals the matrix 15 of compatible silver alloy 2, thereby providing at least one window of oxygen-permeable material for use in the superconductor synthesis step. Advantageously, both side edges 14 of the strand are cut off so as to obtain two oxygen windows.

The precursors are then synthesized into an HTc superconductor phase by a heat treatment step in which:

the filament precursors are properly synthesized into HTc superconductor material, with the oxygen required for synthesis being absorbed through the oxygen windows; and the non-compatible silver alloy 3 is significantly hardened, thereby providing the HTc superconductor multifilament strand with improved mechanical strength.

Having the filaments concentrated in the central portion of the strand, and the fact that the side edges 14 that are poor in filaments have been cut off, ensures that excellent current density $J_e$ is obtained.

The invention also provides a multifilament strand having a matrix 15 of compatible silver alloy 2 that is generally rectangular in shape, having a plurality of HTc superconductor filaments 18 each of cross-section that is generally rectangular in shape and disposed in a configuration that is staggered layer on layer, with two opposite faces of the rectangular shape being covered in respective layers 19 of non-compatible silver alloy 3.

FIGS. 2A to 2E show examples of how the monofilament segments 10 can be arranged within the multifilament billet 12.

FIG. 2A shows a multifilament billet having a 4×8 +5×9 design giving a total of 78 segments. Twelve segments have been replaced in a layered 9-8-7-6-5-6-7-8-9 sequence, thereby leaving 66 segments. Compared with a 78-filament strand, the 66-filament strand is 30% narrower, because of the side edges that have been removed, thereby increasing $J_e$ by 20%.

FIGS. 2B, 2C, and 2D show multifilament billets of 4×8+5×9 design, i.e. 78 segments from which respectively 2, 6, and 10 segments have been replaced.

FIG. 2E shows a multifilament billet having a 5×8+4×9 design, i.e. 76 segments, from which 14 segments have been replaced. Compared with the 76-filament strand, the 62-filament strand presents a width that is 30% smaller corresponding to the side edges that have been cut off, and an increase in $J_e$ of 17%.

What is claimed is:

1. A power in tube type method of manufacturing HTc superconductor multifilament conductor having a matrix of compatible silver alloy, said method comprising the steps of:

a square or rectangular section monofilament having a sheath of compatible silver alloy and a core of HTc superconductor precursors;

cutting up said monofilament into segments and filling a square or rectangular section case of non-compatible silver alloy with the resulting segments, the segments being placed in superposed layers centered in the case of non-compatible silver alloy, each layer being offset relative to the preceding layer so as to form a staggered configuration of the segments;

filling the gaps left by the offset at the being and ends of the layers with bars of compatible silver alloy, thereby making a multifilament billet that is symmetrical about a superposition midplane; and applying mechanical and heat treatments 20 respectively to obtain the final shape of the multifilament strand and to synthesize the precursors into the HTc superconductor phase;

wherein said method comprises the step of, during preparation of the multifilament billet, organizing the number of segments per layer so that, in cross-section, the segment layers viewed as a whole have the general shape of a converging-diverging nozzle, the throat of the converging-diverging nozzle shape being substantially contained in said superposition midplane; and wherein said method further comprises the step of, during the mechanical treatment of said multifilament billet preceding the synthesis heat treatment, applying a rolling force in a direction perpendicular to the superposition midplane, and cutting off at least one of the side edges of the rolled billet perpendicularly to the superposition midplane, thereby revealing the matrix of compatible silver alloy.

2. A manufacturing method according to claim 1, wherein the mechanical treatment includes heat treatment steps of relaxing stresses.

3. A method of manufacture according to claim 1, wherein both side edges perpendicular to the superposition midplane are cut off.

* * * * *